(12) United States Patent
Nishihara et al.

(10) Patent No.: US 8,743,540 B1
(45) Date of Patent: Jun. 3, 2014

(54) ELECTRONIC APPARATUS

(71) Applicants: Noboru Nishihara, Tokyo (JP); Koichi Tatsuyama, Tokyo (JP)

(72) Inventors: Noboru Nishihara, Tokyo (JP); Koichi Tatsuyama, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 0 days.

(21) Appl. No.: 14/114,597

(22) PCT Filed: Jan. 29, 2013

(86) PCT No.: PCT/JP2013/051935
§ 371 (c)(1),
(2), (4) Date: Oct. 29, 2013

(51) Int. Cl.
*H05K 7/20* (2006.01)
*H05K 5/00* (2006.01)
*H05K 7/14* (2006.01)
*H01L 23/427* (2006.01)
*H01L 23/467* (2006.01)
*G01F 1/00* (2006.01)
*G01F 1/20* (2006.01)

(52) U.S. Cl.
CPC .. *H05K 5/00* (2013.01); *H05K 7/14* (2013.01); *H01L 23/427* (2013.01); *H01L 23/467* (2013.01); *G01F 1/00* (2013.01); *G01F 1/20* (2013.01)
USPC ........ 361/692; 361/679.5; 361/690; 361/695; 165/80.3; 165/80.4; 165/104.33; 454/184

(58) Field of Classification Search
CPC ......... H05K 5/00; H05K 7/20; H05K 7/1487; G06F 1/00; G01F 1/20; H01L 23/427; H01L 23/467
USPC ...................... 361/679.46–679.51, 690–697, 361/715–724, 732; 165/80.2–80.5, 104.33, 165/121–126, 185; 312/223.1, 223.2, 236, 312/263; 454/184
See application file for complete search history.

(56) References Cited

U.S. PATENT DOCUMENTS

| 4,730,233 | A  | * | 3/1988  | Osterman ..................... 361/693 |
| 5,477,416 | A  | * | 12/1995 | Schkrohowsky et al. ...... 361/695 |
| 6,201,705 | B1 | * | 3/2001  | Nygren et al. ................. 361/753 |
| 7,554,803 | B2 | * | 6/2009  | Artman et al. ................. 361/695 |
| 7,990,726 | B2 | * | 8/2011  | Izuhara et al. ................. 361/732 |
| 2004/0201957 | A1 | * | 10/2004 | Wu et al. ........................ 361/687 |
| 2007/0133167 | A1 | * | 6/2007  | Wagner et al. ................. 361/687 |
| 2009/0135558 | A1 | * | 5/2009  | Hughes .................... 361/679.46 |

FOREIGN PATENT DOCUMENTS

| JP | 62-177997 A   | 8/1987 |
| JP | 03-010698 U   | 1/1991 |
| JP | 2000-174474 A | 6/2000 |
| JP | 2000-222007 A | 8/2000 |

* cited by examiner

*Primary Examiner* — Michail V Datskovskiy
(74) *Attorney, Agent, or Firm* — Sughrue Mion, PLLC

(57) ABSTRACT

An electronic apparatus has a plurality of basic structures arranged adjacent to each other in a direction perpendicular to a gravitation direction. Each of the basic structures includes a casing, a board placed parallel to the gravitation direction inside the casing, a first space with large ventilation amount and a second space with small ventilation amount formed by the board dividing the inner space of the casing, vents in the upper and lower surfaces of the casing, an electronic component placed on the board in the first space, and an electronic component placed on the board in the second space. The casings of adjacent basic structures are in communication through inner vents in respective side walls of the casings, and external vents in communication with the outside are provided in left and right side walls of the electronic apparatus.

7 Claims, 4 Drawing Sheets

ELECTRONIC APPARATUS

CROSS REFERENCE TO RELATED APPLICATIONS

This is a National Stage of International Application No. PCT/JP2013/051935, filed Jan. 29, 2013, the contents of all of which are incorporated herein by reference in their entirety.

FIELD

The present invention relates to an electronic apparatus equipped with a heat dissipation structure.

BACKGROUND

Conventionally, as to electronic apparatuses structured to have a printed-circuit board attached parallel to a gravitation direction in such a way as to divide the inner space, in the case where the casings of the electronic apparatuses are to be arranged in parallel with side walls of adjacent casings in contact and extending in a direction parallel to the printed-circuit board, the electronic apparatus has been structured to dissipate heat inside the electronic apparatus by convection and ventilation of air through vents provided in the upper and lower surfaces of the casing.

For example, according to Patent Literature 1, for a system in which the casings are arranged in parallel with their side walls in contact, there is a measure where the casing has a vent in communication with an adjacent casing, and outside air is supplied through this vent to the inside of the casing.

Further, according to Patent Literature 2, there is a measure where a vent is provided downwind of one of spaces partitioned by a wall in the same casing and where air in one of the spaces is discharged by negative pressure action into the other space, thereby obtaining a cooling effect.

CITATION LIST

Patent Literature

Patent Literature 1: Japanese Patent Application Laid-open No. 62-177997
Patent Literature 2: Japanese Patent Application Laid-open No. 2000-174474

SUMMARY

Technical Problem

However, according to the above conventional art, for example, in Patent Literature 1, the space in a casing where a heat-generating component exists is separated by a bulkhead from an adjacent identical space, and hence air does not flow in or out between the spaces, so that the effect of directly helping an adjacent electronic apparatus in heat dissipation is not obtained.

Under the condition that a printed-circuit board is placed in such a way as to divide the inner space of the casing, in the case where a cooling fan is placed on the opposite side from a space having a vent for introducing outside air, the flow of air is cut off which is formed by the cooling fan taking in air from outside the casing and discharging the air back into the outside of the casing.

Further, in the case where a cooling fan is placed in the space having the vent for introducing outside air, no vent is in the space on the opposite side of a printed-circuit board, and thus convection effective in heat dissipation cannot be expected. Hence, there is the problem that it is difficult to mount a high heat-generating component or an electronic component having a low heatproof temperature on the side facing this space of the printed-circuit board.

Yet further, Patent Literature 2, disclosing an idea created assuming an electronic apparatus to be installed alone, is not aimed at the effect of improving heat dissipation efficiency by arranging the same electronic apparatuses adjacent to each other.

Under the condition that a printed-circuit board is placed in such a way as to divide the inner space of the casing and that electronic apparatuses in which components that need heat dissipation are mounted on both sides of the printed-circuit board are arranged adjacent to each other, a vent needs to be provided in the printed-circuit board, and thus there is the drawback that the mounting area for electronic components is reduced.

The present invention was made in view of the above facts, and an object thereof is to provide an electronic apparatus which is structured to have a printed-circuit board attached in such a way as to divide the inner space of the casing and which has a heat dissipation structure that enables higher performance and the casing to be made smaller by having a space of an adjacent electronic apparatus with a large ventilation amount support a space with a small ventilation amount in heat dissipation so as to improve heat dissipation efficiency of the electronic apparatuses arranged in parallel as a whole.

Solution to Problem

The present invention is directed to an electronic apparatus that achieves the object. The electronic apparatus has a plurality of basic structures arranged adjacent to each other in a direction perpendicular to a gravitation direction. Each of the basic structures includes a casing; a board placed parallel to the gravitation direction inside the casing; a space with large ventilation amount and a space with small ventilation amount formed by the board dividing the inner space of the casing, the ventilation amounts depending on the size of their air passage; vents in the upper and lower surfaces of the casing; an electronic component placed on the board in the space with large ventilation amount; and an electronic component placed on the board in the space with small ventilation amount. The casings of adjacent ones of the basic structures are in communication through inner vents in respective side walls of the casings, and external vents that are in communication with the outside are provided in left and right side walls of the electronic apparatus.

Advantageous Effects of Invention

In the electronic apparatus having a heat dissipation structure according to the present invention, air can be made to flow in and out between a space with a large ventilation amount formed by a printed-circuit board dividing the space inside the casing of an electronic apparatus that is the basic structure and a space with a small ventilation amount in an adjacent electronic apparatus that is the basic structure via a vent in communication with the spaces. Hence, the ventilation amount can be increased by air in the space with a large ventilation amount pulling air in the space with a small ventilation amount via the vent in communication with the spaces, and hence the electronic apparatus can support the adjacent electronic apparatus that is the basic structure in heat dissipation, so that the effect of suppressing reduction in heat dissipation efficiency due to a plurality of the electronic apparatuses that are the same basic structure being arranged adjacent to each other is obtained. Further, because a vent need not be provided in the board, reduction in the mounting area of the electronic apparatus can be prevented.

DESCRIPTION OF EMBODIMENTS

The configurations of the electronic apparatuses according to embodiments of the present invention will be described in detail below with reference to the drawings. Note that these embodiments are not intended to limit the present invention.

Figure 1:
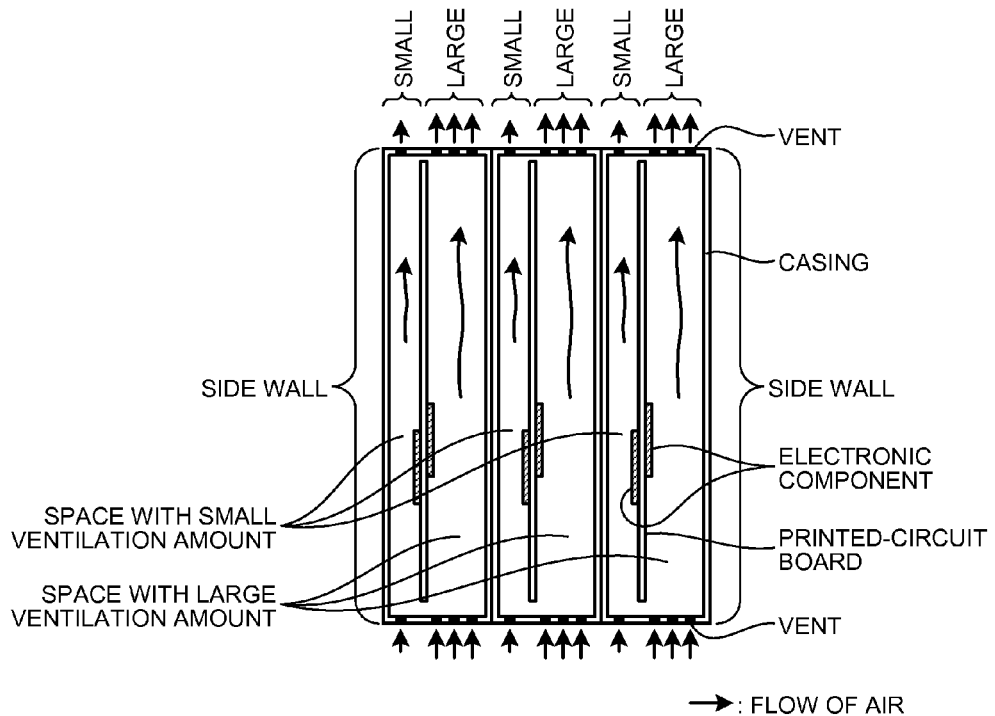
FIG. 1 is a cross-sectional view showing a state where conventional electronic apparatuses arranged in close contact are dissipating heat.

Conventionally, as to electronic apparatuses structured to have a printed-circuit board attached parallel to a gravitation direction in such a way as to divide the inner space as shown in FIG. 1, in the case where the casings of the electronic apparatuses are to be arranged in parallel with side walls of adjacent casings in contact and extending in a direction parallel to the printed-circuit board, the electronic apparatus has been structured to dissipate heat inside the electronic apparatus by convection and ventilation of air through vents provided in the upper and lower surfaces of the casing.

However, because a connector or the like as an obstacle to convective air is placed on the upper and lower surfaces of the casing, or the printed-circuit board is attached adjacent to the inner wall of a side of the casing, there is a space that does not have enough vent area for ventilation in the upper and lower surfaces of the casing, and thus there may be a large difference between a space with a large ventilation amount and a space with a small ventilation amount.

Hence, it is difficult to mount a high heat-generating component or an electronic component having a low heatproof temperature on the side facing a space with a small ventilation amount of the printed-circuit board, which poses a restriction in making the printed-circuit board be higher in density and the electronic apparatus be higher in performance.

Figure 2:
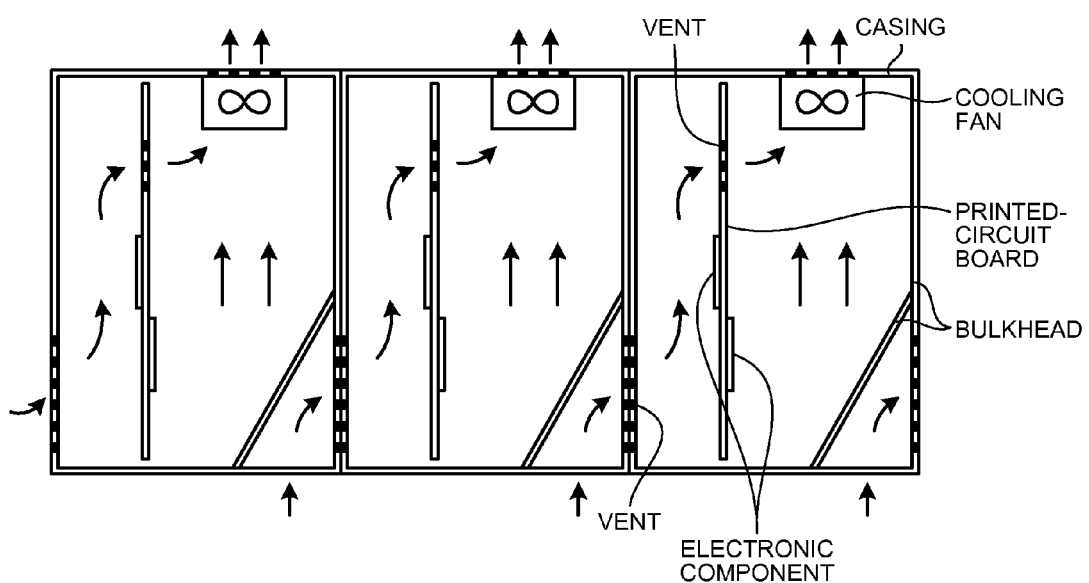
FIG. 2 is a cross-sectional view showing a heat dissipating state of an electronic apparatus having a heat dissipation structure according to an embodiment of the present invention.

Accordingly, in the present embodiment, first, the situation is considered where a printed-circuit board is placed in such a way as to divide the inner space of the casing as shown in, e.g., FIG. 2 and where electronic apparatuses in which components that need heat dissipation are mounted on both sides of the printed-circuit board are arranged adjacent to each other. Even with the electronic apparatus having this heat dissipation structure, the space in the casing where a heat-generating component exists is separated by a bulkhead from the identical space of an adjacent electronic apparatus, and hence air does not flow in or out between the spaces, so that the effect of directly helping an adjacent electronic apparatus in heat dissipation is not obtained.

Further, in order that a cooling fan makes air flow from a space having a vent for introducing outside air to a space on the opposite side of the printed-circuit board, a vent needs to be provided in the printed-circuit board, and thus there is the drawback that the mounting area of the printed-circuit board of the electronic apparatus is reduced.

First Embodiment

Figure 3:
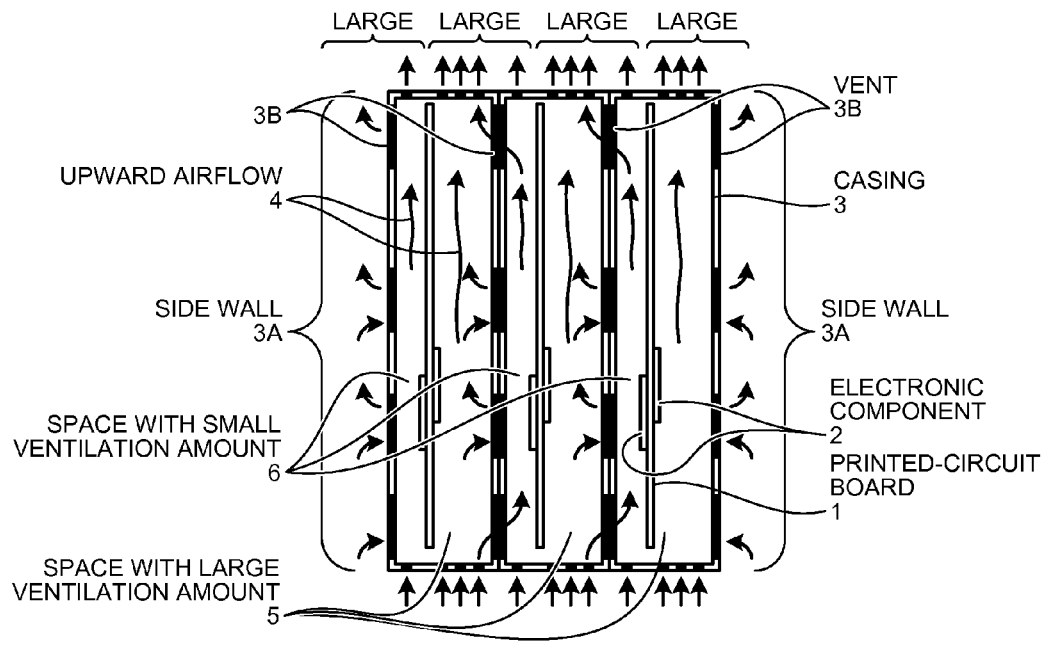
FIG. 3 is a cross-sectional view showing a heat dissipating state of an electronic apparatus having a heat dissipation structure according to a first embodiment of the present invention.

FIG. 3 is a cross-sectional view showing a heat dissipating state of an electronic apparatus having a heat dissipation structure according to a first embodiment of the present invention. In FIG. 3, electronic apparatuses that each are a basic structure comprising a casing 3, a printed-circuit board 1, and electronic components 2 mounted, are arranged adjacent to each other and parallel to a gravitation direction. FIG. 3 shows a state where heat generated by the electronic components 2 is dissipated by upward airflows 4 flowing from the lower surface of the casing toward the upper surface. That is, FIG. 3 is a diagram showing a state where upward airflows 4 due to heat generation of the electronic components 2 cause air to flow into and out of the casing through vents provided in the upper, lower, left, and right surfaces of the casing so as to dissipate heat.

That is, an electronic apparatus having a heat dissipation structure according to the present embodiment is one having a plurality of electronic apparatuses arranged adjacent to each other in a direction perpendicular to a gravitation direction, each of which is a basic structure including a casing 3, a printed-circuit board 1 placed parallel to a gravitation direction inside the casing 3, a space 5 with large ventilation amount and a space 6 with small ventilation amount formed by the printed-circuit board 1 dividing the inner space of the casing 3, the ventilation amounts depending on the size of the air passage, vents in the upper and lower surfaces of the casing 3, an electronic component 2 placed in the space 5 with large ventilation amount and on the printed-circuit board 1, and an electronic component 2 placed in the space 6 with small ventilation amount and on the printed-circuit board 1. The casings of adjacent electronic apparatuses that are the same basic structure are in communication through inner vents 3B in their respective side walls, and external vents 3B that are in communication with the outside are provided in the left and right side walls of the overall electronic apparatus.

Vents 3B are formed open at bilaterally symmetrical positions across side walls 3A of the casing of each of the electronic apparatuses having the casings 3 of a common basic structure, which side walls are in close contact with adjacent electronic apparatuses, and hence air flowing inside the casing can freely move out and in between adjacent electronic apparatuses that are the same basic structure.

As to the electronic apparatus that is the basic structure installed farthest to the right or left, through vents 3B provided across the casing side wall next to which an electronic apparatus that is the basic structure is not installed, ambient air can freely move out of and into the electronic apparatus, and hence a larger ventilation amount can be secured as compared with the case where the side wall 3A has no vents 3B.

In the case where the space 5 with a large ventilation amount and the space 6 with a small ventilation amount, the ventilation amounts depending on the size of the air passage, are formed by the printed-circuit board 1 attached in such a way as to divide the space inside the casing of the electronic apparatus, an upward airflow 4 that is a flow of air ascending in the space 5 with a large ventilation amount acts to pull air in the space 6 with a small ventilation amount of an adjacent electronic apparatus that is the basic structure via vents 3B. That is, the upward airflow 4 in the space 5 promotes the flow of an upward airflow 4 in the space 6 with a small ventilation amount of an adjacent electronic apparatus that is the basic structure. As such, each electronic apparatus that is the basic structure supports an adjacent electronic apparatus that is the basic structure in heat dissipation, and thereby the overall heat dissipation efficiency of the plurality of electronic apparatuses arranged in close contact can be improved.

Hence, an electronic component 2 of low heat resistance can be mounted on the side of the printed-circuit board 1 facing the space 6 with a small ventilation amount, and thus the printed-circuit board 1 can be made higher in density, resulting in the electronic apparatus becoming higher in performance.

Second Embodiment

Figure 4:
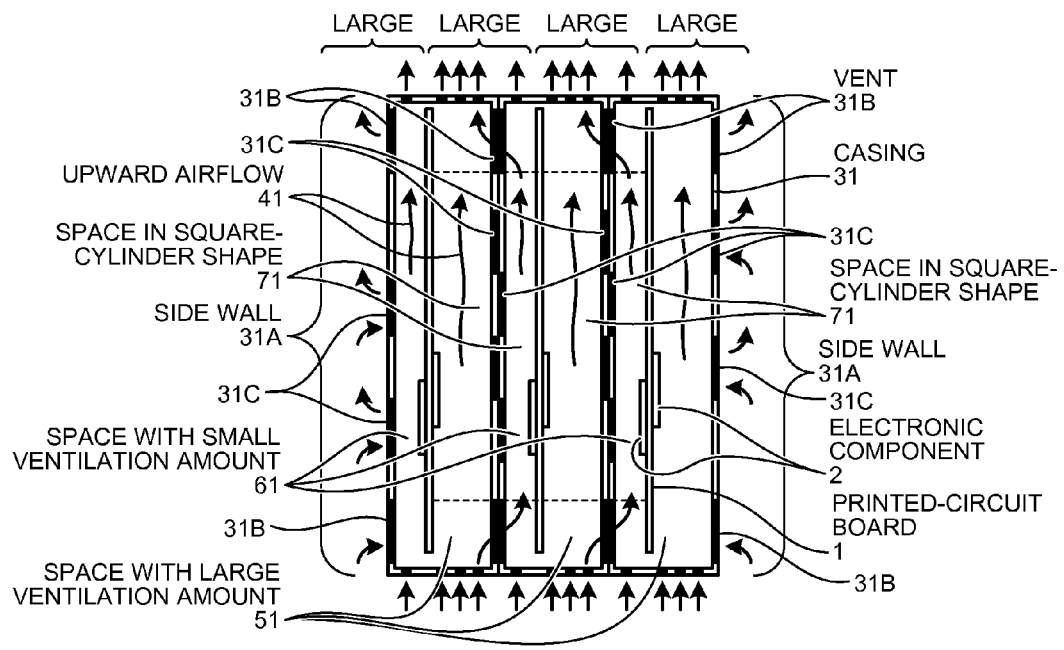
FIG. 4 is a cross-sectional view showing a heat dissipating state of an electronic apparatus having a heat dissipation structure according to a second embodiment of the present invention.

FIG. 4 is a cross-sectional view showing a heat dissipating state of an electronic apparatus having a heat dissipation structure according to a second embodiment of the present invention. In FIG. 4, electronic apparatuses that each are a basic structure comprising a casing 31, a printed-circuit board 1, and electronic components 2 mounted are arranged adjacent to each other and parallel to a gravitation direction, and FIG. 4 shows a state where heat generated by the electronic components 2 is dissipated by upward airflows 41 flowing from the lower surface of the casing toward the upper surface. That is, FIG. 4 is a diagram showing a state where upward airflows 41 due to heat generation of the electronic components 2 cause air to flow into and out of the casing through vents provided in the upper, lower, left, and right surfaces of the casing so as to dissipate heat.

Upper and lower vents 31B and vents 31C between them are provided across the side walls 31A of the casing of each of the electronic apparatuses having the casings 31 of a common basic structure, which side walls are in close contact with adjacent electronic apparatuses, and the vents 31C in the middle of the side walls 31A are bilaterally asymmetrically formed open to be offset in position such that the vents 31C do not extend through as a whole when an electronic apparatus that is the basic structure is placed in close contact with it. That is, in the present embodiment, the left-right opening structure of the casing 31 is asymmetrical.

The vents 31B in the upper and lower parts of the side walls 31A are located at bilaterally symmetrical positions and formed open to extend through the side walls 31A as a whole, and hence air flowing inside the casing 31 can freely move out and in between electronic apparatuses in close contact that are the basic structure. That is, the casings of adjacent electronic apparatuses that are the basic structure are in communication only via the vents 31B provided in the upper and lower parts of their respective side walls.

As to the electronic apparatus that is the basic structure installed farthest to the right or left, through vents 31B and 31C provided across the side wall 31A next to which an electronic apparatus is not installed, ambient air can freely move out of and into the electronic apparatus, and hence a larger ventilation amount can be secured as compared with the case where the side wall 31A has no vents 31B, 31C.

In the case where a space 51 with a large ventilation amount and a space 61 with a small ventilation amount, the ventilation amounts depending on the size of the air passage, are formed by the printed-circuit board 1 attached in such a way as to divide the space inside the casing of the electronic apparatus, an upward airflow 41 that is a flow of air ascending in the space 51 with a large ventilation amount acts to pull air in the space 61 with a small ventilation amount of an adjacent electronic apparatus that is the basic structure. That is, the upward airflow 41 in the space 51 promotes the flow of an upward airflow 41 in the space 61 with a small ventilation amount of an adjacent electronic apparatus that is the basic structure. As such, each electronic apparatus that is the basic structure supports an adjacent electronic apparatus that is the basic structure in heat dissipation, and thereby the overall heat dissipation efficiency of the plurality of electronic apparatuses arranged in close contact can be improved.

Hence, an electronic component 2 of low heat resistance can be mounted on the side of the printed-circuit board 1 facing the space 61 with a small ventilation amount, and thus the printed-circuit board 1 can be made higher in density, resulting in the electronic apparatus becoming higher in performance.

Because the vents 31C in the middle of the adjacent side surfaces of the casings of adjacent electronic apparatuses that are the basic structure do not extend through as a whole, even if air of high temperature flows in the space 51 with a large ventilation amount, much less of the air of high temperature gets into the space 61 with a small ventilation amount. Hence, the effect of preventing heat transfer to an electronic component 2 having a low heatproof temperature by convection is obtained.

Also, because the vents 31C in the middle of the adjacent side surfaces of the casings do not extend through as a whole, heat transfer from an electronic component 2 of high temperature to an electronic component 2 of low heat resistance mounted in an adjacent electronic apparatus that is the basic structure by radiation can be reduced.

Further, a space 71 in a square-cylinder shape that is formed in the middle of the electronic apparatus because the vents 31C in the left and right side walls 31A are offset in position such that the vents 31C do not extend through as a whole, produces a chimney effect, and thus the effect of promoting the upward airflow 41 can be obtained.

Third Embodiment

Figure 5:
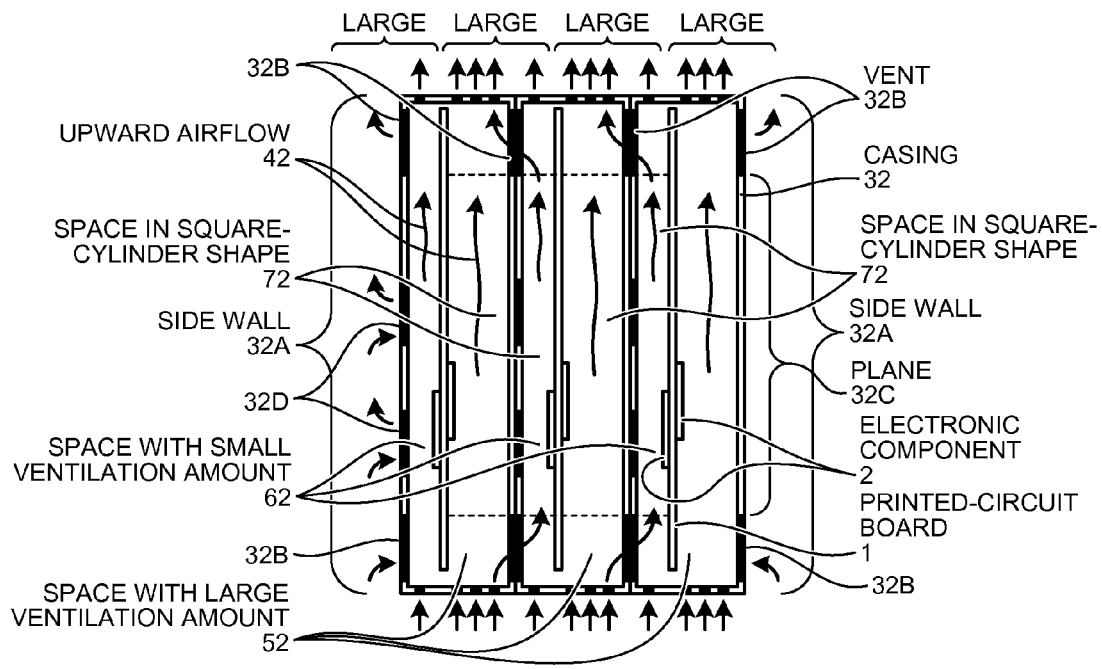
FIG. 5 is a cross-sectional view showing a heat dissipating state of an electronic apparatus having a heat dissipation structure according to a third embodiment of the present invention.

FIG. 5 is a cross-sectional view showing a heat dissipating state of an electronic apparatus having a heat dissipation structure according to a third embodiment of the present invention. In FIG. 5, electronic apparatuses that each are a basic structure comprising a casing 32, a printed-circuit board 1, and electronic components 2 mounted are arranged adjacent to each other and parallel to a gravitation direction, and FIG. 5 shows a state where heat generated by the electronic components 2 is dissipated by upward airflows 42 flowing from the lower surface of the casing toward the upper surface. That is, FIG. 5 is a diagram showing a state where upward airflows 42 due to heat generation of the electronic components 2 cause air to flow into and out of the casing through vents provided in the upper, lower, left, and right surfaces of the casing so as to dissipate heat.

Upper and lower vents 32B and vents 32D between them are provided across one (e.g., the left side in FIG. 5) of the side walls 32A of the casing of each of the electronic apparatuses having the casings 32 of a common basic structure, which side walls are in close contact with adjacent electronic apparatuses. In the middle of the other side wall 32A (e.g., the right side in FIG. 5), there is a plane 32C for displaying rated values and the like, and vents 32B are provided above and below this plane. That is, also in the present embodiment, the left-right opening structure of the casing 32 is asymmetrical.

The vents 32B are provided in the upper and lower parts of either side wall 32A, left and right, and hence air can freely move out and in between electronic apparatuses in close contact that are the basic structure. That is, the casings of adjacent electronic apparatuses that are the basic structure are in communication only via the vents 32B provided in the upper and lower parts of their respective side walls.

As to the electronic apparatus installed farthest to the right or left, through vents 32B and 32D provided across the side wall 32A of the casing 32 next to which an electronic apparatus is not installed and which has no plane 32C for displaying rated values and the like, for example, the side wall 32A on the left side in FIG. 5, ambient air can freely move out of and into the electronic apparatus, and also as to the side wall 32A which has a plane 32C (e.g., the right side in FIG. 5), the same action can be obtained through the vents 32B provided in the upper and lower parts thereof.

In the case where a space 52 with a large ventilation amount and a space 62 with a small ventilation amount, the ventilation amounts depending on the size of the air passage, are formed by the printed-circuit board 1 attached in such a way as to divide the space inside the casing of the electronic apparatus, an upward airflow 42 that is a flow of air ascending in the space 52 with a large ventilation amount acts to pull air in the space 62 with a small ventilation amount of an adjacent electronic apparatus that is the basic structure. That is, the upward airflow 42 in the space 52 promotes the flow of an upward airflow 42 in the space 62 with a small ventilation amount of an adjacent electronic apparatus that is the basic structure. As such, each electronic apparatus that is the basic structure supports an adjacent electronic apparatus that is the basic structure in heat dissipation, and thereby the overall heat dissipation efficiency of the plurality of electronic apparatuses arranged in close contact can be improved.

Hence, an electronic component 2 of low heat resistance can be mounted on the side of the printed-circuit board 1 facing the space 62 with a small ventilation amount, and thus the printed-circuit board 1 can be made higher in density, resulting in the electronic apparatus becoming higher in performance.

There is necessarily the plane 32C for displaying rated values in the middle of the side wall 32A of either one of adjacent electronic apparatuses, the side wall being next to the other electronic apparatus, and in the case where the vents 32D are blocked by the plane 32C, not extending through, even if air of high temperature flows in the space 52 with a large ventilation amount, much less of the air of high temperature gets into the space 62 with a small ventilation amount. Hence, the effect of preventing heat transfer to an electronic component 2 having a low heatproof temperature by convection is obtained.

Also, because no through hole exists in the middle of one of the adjacent casing side walls 32A, heat transfer from an electronic component 2 of high temperature to an electronic component 2 of low heat resistance mounted in an adjacent electronic apparatus that is the basic structure by radiation can be reduced.

Further, a space 72 in a square-cylinder shape that is formed by the presence of the plane 32C for displaying rated values and the like, produces a chimney effect, and thus the effect of promoting the upward airflow 42 can be obtained.

Fourth Embodiment

Figure 6:
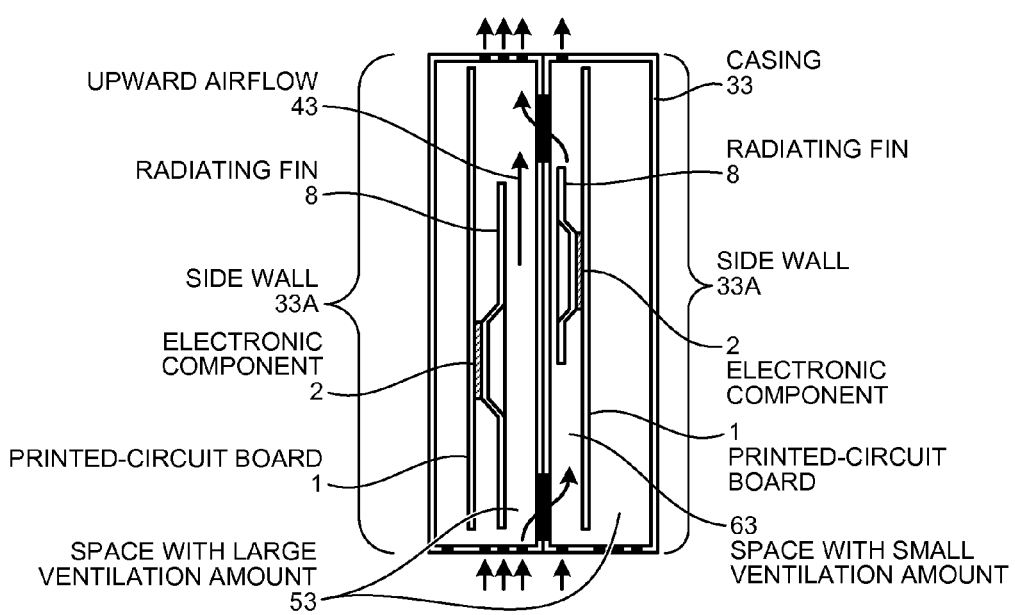
FIG. 6 is a cross-sectional view showing a heat dissipating state of an electronic apparatus having a heat dissipation structure according to a fourth embodiment of the present invention.

FIG. 6 is a cross-sectional view showing a heat dissipating state of an electronic apparatus having a heat dissipation structure according to a fourth embodiment of the present invention. An electronic apparatus in FIG. 6 comprises a casing 33, a printed-circuit board 1, an electronic component 2 mounted, and a radiating fin 8 mounted on the electronic component 2. The radiating fin 8 is mounted on the opposite surface of the electronic component 2 to its surface stuck to the printed-circuit board 1. FIG. 6 shows the situation where two of the electronic apparatuses that are the same basic structure are adjacent and parallel to each other, and description of others than characteristic parts is omitted in the present embodiment. FIG. 6 shows a state where heat generated by the electronic component 2 is being dissipated by an upward airflow 43 flowing from the lower surface of the casing toward the upper surface.

Also in FIG. 6 showing the heat dissipation structure of the electronic apparatus according to the present fourth embodiment, a space 53 with a large ventilation amount and a space 63 with a small ventilation amount, the ventilation amounts depending on the size of the air passage, are formed by the printed-circuit board 1 attached in such a way as to divide the space inside the casing of the electronic apparatus. In FIG. 6, by providing the structure of vents shown in any of first to third embodiments in casing side walls 33A, an upward airflow 43 that is a flow of air ascending in the space 53 with a large ventilation amount acts to pull air in the space 63 with a small ventilation amount of an adjacent electronic apparatus that is the basic structure. That is, the upward airflow 43 in the space 53 promotes the flow of an upward airflow in the space 63 with a small ventilation amount of an adjacent electronic apparatus that is the basic structure. As such, each electronic apparatus that is the basic structure supports an adjacent electronic apparatus in heat dissipation, and thereby the overall heat dissipation efficiency of the plurality of electronic apparatuses arranged in close contact can be improved.

Hence, the radiating fin 8 attached in the space 63 with a small ventilation amount can be made smaller or reduced as compared with conventional ones, and thus the number of assembly man-hours and costs can be reduced. Further, the product mass of the electronic apparatus can be reduced, so that vibration resistance is also improved.

Fifth Embodiment

Figure 7:
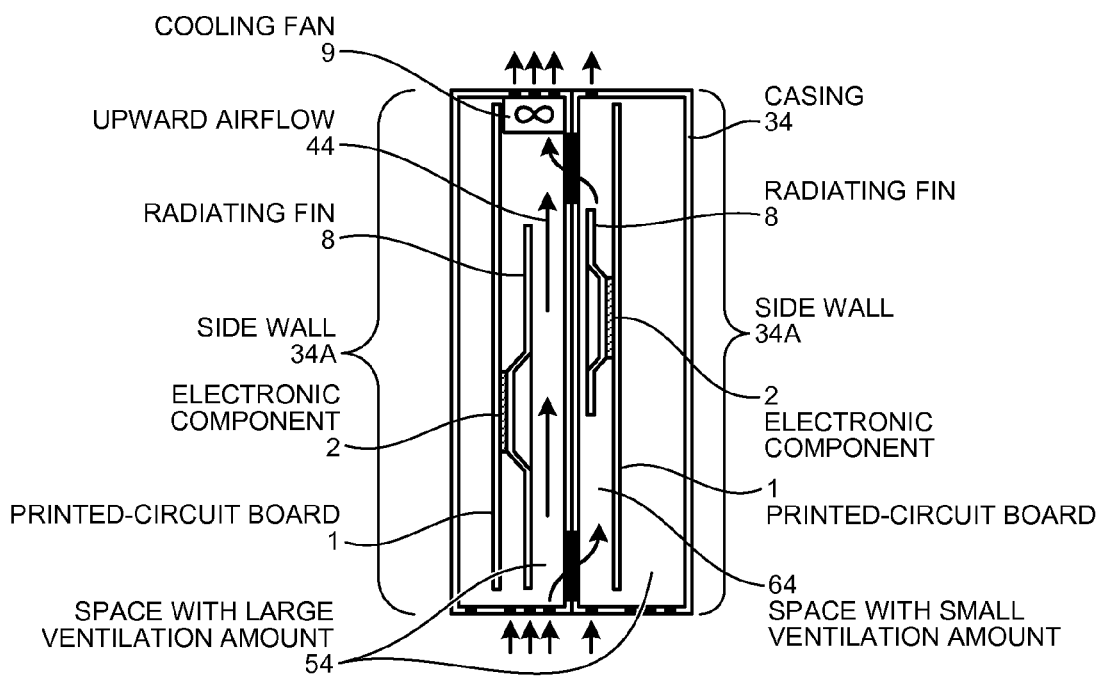
FIG. 7 is a cross-sectional view showing a heat dissipating state of an electronic apparatus having a heat dissipation structure according to a fifth embodiment of the present invention.

FIG. 7 is a cross-sectional view showing a heat dissipating state of an electronic apparatus having a heat dissipation structure according to a fifth embodiment of the present invention. An electronic apparatus in FIG. 7 comprises a casing 34, a printed-circuit board 1, an electronic component 2 mounted, a radiating fin 8 mounted on the electronic component 2, and a cooling fan 9. FIG. 7 is one produced by adding the cooling fan 9 to FIG. 6. Also in FIG. 7 showing the heat dissipation structure of the electronic apparatus according to the present fifth embodiment, a space 54 with a large ventilation amount and a space 64 with a small ventilation amount, the ventilation amounts depending on the size of the air passage, are formed by the printed-circuit board 1 attached in such a way as to divide the space inside the casing of the electronic apparatus. The cooling fan 9 is provided in the upper part of the space 54 with a large ventilation amount and immediately under the vent provided in the upper surface of the casing. FIG. 7 shows the situation where two of the electronic apparatuses that are the same basic structure are adjacent and parallel to each other, and description of others than characteristic parts is omitted in the present embodiment. FIG. 7 shows a state where the electronic apparatus is generating forced convection from the lower surface of the casing toward the upper surface by the cooling fan 9 to dissipate heat generated by the electronic components 2.

In FIG. 7, by providing the structure of vents shown in any of first to third embodiments in casing side walls 34A, the forced convection generated by the cooling fan 9 in the space 54 with a large ventilation amount acts to pull air in the space 64 with a small ventilation amount of an adjacent electronic apparatus that is the basic structure. That is, the forced convection promotes the flow of an upward airflow in the space 64 with a small ventilation amount of an adjacent electronic apparatus that is the basic structure. As such, each electronic apparatus that is the basic structure supports an adjacent electronic apparatus in heat dissipation, and thereby the overall heat dissipation efficiency of the plurality of electronic apparatuses arranged in close contact can be improved.

Hence, the cooling fan 9 and the radiating fin 8 necessary for the space 64 with a small ventilation amount can be made smaller or reduced, and thus the number of assembly man-hours and costs can be reduced. Further, the product mass of the electronic apparatus can be reduced, so that vibration resistance is also improved.

The present invention is not limited to the above embodiments, but various changes can be made thereto without departing from the gist thereof in implementation. Further, since the above embodiments include inventions of various stages, various inventions can be extracted by appropriate combination of a plurality of disclosed constituents. For example, if with a configuration without some of all the constituents shown in an embodiment, the problem stated in the subsection titled Technical Problem can be solved, and the effect stated in the subsection titled Advantageous Effects of Invention is obtained, this configuration without some of all the constituents can be extracted as an invention. Further, constituents of different embodiments may be combined as needed.

INDUSTRIAL APPLICABILITY

As described above, an electronic apparatus having a heat dissipation structure according to the present invention is useful for an electronic apparatus having a printed-circuit board attached in such a way as to divide the inner space and is suitable for heat dissipation especially for an electronic component of low heat resistance in an electronic apparatus having a printed-circuit board on which electronic components are mounted.

REFERENCE SIGNS LIST

1 Printed-circuit board; 2 Electronic component; 3, 31, 32, 33, 34 Casing; 4, 41, 42, 43, 44 Upward airflow; 5, 51, 52, 53, 54 Space with a large ventilation amount; 6, 61, 62, 63, 64 Space with a small ventilation amount; 8 Radiating fin; 9 Cooling fan; 71, 72 Space in a square-cylinder shape; 3A, 31A, 32A, 33A, 34A Side wall; 3B, 31B, 31C, 32B, 32D Vent; 32C Plane

The invention claimed is:

1. An electronic apparatus which has a plurality of basic structures arranged adjacent to each other in a direction perpendicular to a gravitation direction, each of the basic structures comprising:
   a casing;
   a board placed parallel to the gravitation direction inside the casing;
   a space with large ventilation amount and a space with small ventilation amount formed by the board dividing the inner space of the casing, the ventilation amounts depending on the size of their air passage;
   vents in the upper and lower surfaces of the casing;
   an electronic component placed on the board in the space with large ventilation amount; and
   an electronic component placed on the board in the space with small ventilation amount,
   wherein the casings of adjacent ones of the basic structures are in communication through inner vents in respective side walls of the casings, and external vents that are in communication with the outside are provided in left and right side walls of the electronic apparatus.

2. The electronic apparatus according to claim 1, wherein left and right side walls of the casing of the basic structure are symmetrical in structure.

3. The electronic apparatus according to claim 1, wherein left and right side walls of the casing of the basic structure are asymmetrical in structure.

4. The electronic apparatus according to claim 3, wherein the casings of adjacent ones of the basic structures are in communication only via inner upper and lower vents provided in the upper and lower parts of respective side walls of the casings.

5. The electronic apparatus according to claim 4, wherein either one of the left and right side walls of the electronic apparatus has external upper and lower vents provided in the upper and lower parts thereof, via only which the inside is in communication with the outside, and a plane without a vent in the middle between the external upper and lower vents, and the other has the external vent in its part corresponding to the plane without a vent.

6. The electronic apparatus according to claim 1, wherein a radiating fin is provided on the electronic component.

7. The electronic apparatus according to claim 1, wherein a cooling fan is provided under a vent provided in the upper surface of the casing and in the space with large ventilation amount.

* * * * *